US009165841B2

(12) United States Patent
Meyer

(10) Patent No.: US 9,165,841 B2
(45) Date of Patent: Oct. 20, 2015

(54) SYSTEM AND PROCESS FOR FABRICATING SEMICONDUCTOR PACKAGES

(71) Applicant: Intel Mobile Communications GmbH, Neubiberg (DE)

(72) Inventor: Thorsten Meyer, Regensburg (DE)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/828,541

(22) Filed: Mar. 14, 2013

(65) Prior Publication Data

US 2014/0106507 A1 Apr. 17, 2014

Related U.S. Application Data

(63) Continuation-in-part of application No. 12/234,259, filed on Sep. 19, 2008.

(51) Int. Cl.
*H01L 21/00* (2006.01)
*H01L 21/66* (2006.01)
(Continued)

(52) U.S. Cl.
CPC ............ *H01L 22/10* (2013.01); *G03F 7/70991* (2013.01); *G03F 9/7003* (2013.01); *G03F 9/7011* (2013.01); *H01L 24/19* (2013.01); *H01L 24/64* (2013.01); *H01L 24/96* (2013.01); *H01L 21/568* (2013.01); *H01L 2224/02311* (2013.01); *H01L 2224/02381* (2013.01); *H01L 2224/0401* (2013.01); *H01L 2224/04105* (2013.01); *H01L 2224/05548* (2013.01); *H01L 2224/11013* (2013.01); *H01L 2224/12105* (2013.01); *H01L 2224/131* (2013.01); *H01L 2224/13006* (2013.01); *H01L 2224/13022* (2013.01); *H01L 2224/13024* (2013.01)

(58) Field of Classification Search
CPC .............................. H01L 22/12; H01L 27/016
See application file for complete search history.

(56) References Cited

U.S. PATENT DOCUMENTS 5,144,747 A * 9/1992 Eichelberger .................. 29/834
5,705,320 A 1/1998 Hsu et al.
(Continued)

FOREIGN PATENT DOCUMENTS

DE 102004033057 A1 6/2005
DE 102004055037 A1 5/2006
(Continued)

OTHER PUBLICATIONS

"An Embedded Device Technology Based on a Molded Reconfigured Wafer," Electronic Components and Technology Conference, 2006. Proceedings. 56th Volume, May 30, 2006, (5 pages).
(Continued)

*Primary Examiner* — Benjamin Sandvik
*Assistant Examiner* — Herve Assouman
(74) *Attorney, Agent, or Firm* — Blakely, Sokoloff, Taylor & Zafman LLP

(57) ABSTRACT

A method of processing semiconductor chips includes measuring locations of semiconductor dies placed on a carrier with a scanner to generate die location information. The method includes applying a dielectric layer over the semiconductor dies and communicating the die location information to a laser assembly. The method includes aligning the laser assembly with the carrier and laser structuring the dielectric layer with the laser assembly based on the die location information generated by the scanner.

19 Claims, 16 Drawing Sheets

(51) Int. Cl.
*H01L 23/00* (2006.01)
*G03F 7/20* (2006.01)
*G03F 9/00* (2006.01)
*H01L 21/56* (2006.01)

(56) References Cited

U.S. PATENT DOCUMENTS

| | | | |
|---|---|---|---|
| 5,869,383 | A | 2/1999 | Chien et al. |
| 5,972,798 | A | 10/1999 | Jang et al. |
| 6,084,778 | A | 7/2000 | Malhi |
| 6,356,453 | B1 | 3/2002 | Juskey et al. |
| 6,372,527 | B1 * | 4/2002 | Khandros et al. ............ 438/15 |
| 6,495,912 | B1 | 12/2002 | Huang et al. |
| 6,546,620 | B1 | 4/2003 | Juskey et al. |
| 6,790,759 | B1 * | 9/2004 | Wang et al. ............ 438/612 |
| 6,825,559 | B2 | 11/2004 | Mishra et al. |
| 7,060,525 | B1 | 6/2006 | Tilly |
| 7,166,917 | B2 | 1/2007 | Yang et al. |
| 7,185,426 | B1 * | 3/2007 | Hiner et al. ............ 29/841 |
| 7,202,560 | B2 | 4/2007 | Dungan et al. |
| 7,208,824 | B2 | 4/2007 | Lee et al. |
| 8,555,494 | B2 * | 10/2013 | Jomaa ............ 29/852 |
| 2002/0114143 | A1 | 8/2002 | Morrison et al. |
| 2002/0153616 | A1 | 10/2002 | Kunihisa et al. |
| 2003/0124868 | A1 * | 7/2003 | Mizukoshi ............ 438/710 |
| 2004/0049912 | A1 * | 3/2004 | Akagawa et al. ............ 29/846 |
| 2005/0004604 | A1 | 1/2005 | Liebler |
| 2005/0023664 | A1 | 2/2005 | Chudzik et al. |
| 2005/0067716 | A1 | 3/2005 | Mishra et al. |
| 2005/0173786 | A1 | 8/2005 | Huang |
| 2005/0194687 | A1 | 9/2005 | Yamaguchi |
| 2006/0160346 | A1 * | 7/2006 | Hori ............ 438/612 |
| 2006/0245308 | A1 | 11/2006 | Macropoulos et al. |
| 2006/0263937 | A1 * | 11/2006 | Fukase et al. ............ 438/108 |
| 2007/0045575 | A1 * | 3/2007 | Bruland ............ 250/559.13 |
| 2007/0063721 | A1 * | 3/2007 | Dozier et al. ............ 324/754 |
| 2008/0054445 | A1 * | 3/2008 | Chiu et al. ............ 257/700 |
| 2009/0020864 | A1 * | 1/2009 | Pu et al. ............ 257/687 |

FOREIGN PATENT DOCUMENTS

| | | |
|---|---|---|
| DE | 102006032251 A1 | 1/2008 |
| JP | 07086612 | 3/1995 |
| WO | 00/04577 | 1/2000 |

OTHER PUBLICATIONS

"Taking Wafer Level Packaging to the Next Stage: A 200 mm Silicon Technology Compatible Embedded Device Technology," Advanced Packaging Conference, SEMICON Europa 2006, Munich, Germany, Apr. 4, 2006 (17 pages).

Office Action mailed Jul. 23, 2012 in U.S. Appl. No. 12/234,259.

* cited by examiner

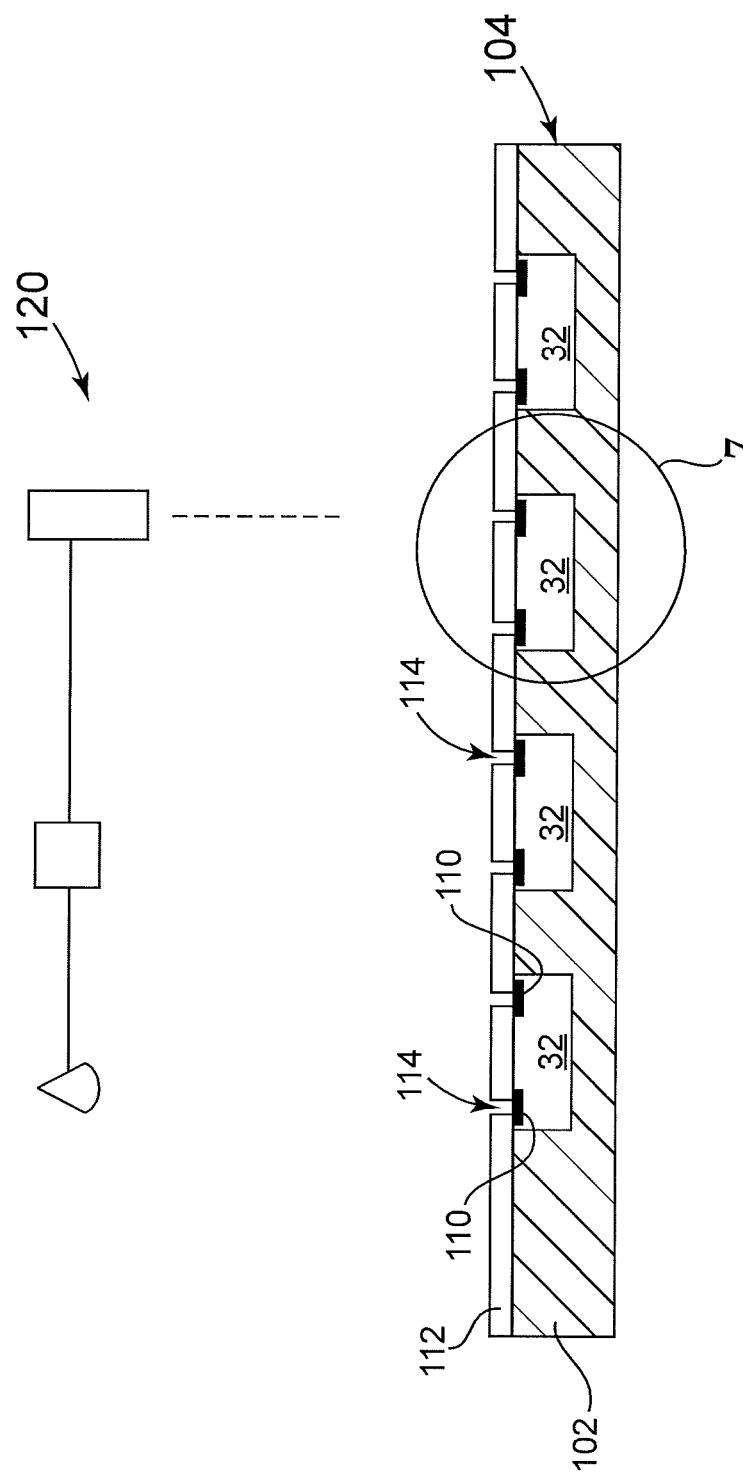

SYSTEM AND PROCESS FOR FABRICATING SEMICONDUCTOR PACKAGES

CROSS-REFERENCE TO RELATED APPLICATION

This Utility Patent Application is a continuation-in-part of U.S. patent application Ser. No. 12/234,259, filed Sep. 19, 2008, which is incorporated herein by reference.

BACKGROUND

Semiconductor chips include contact pads on one or more surfaces. Semiconductor packages may include one or more of the chips encapsulated in an electrically non-conducting material. External contact elements of the package are electrically connected to the contact pads of the chip. The contact pads of the chips are generally small. For example, some contact pads are square having a side dimension of about 60 micrometers. The known connection technologies have limits making it time consuming (and thus expensive) to accurately connect the external contact elements to the contact pads. In addition, the position or location of the contact pads for certain packaging technologies can shift as the chips are picked/placed and encapsulated, which has the potential to negatively affect the electrical connection between the external contact elements of the package and the contact pads.

For these and other reasons there is a need for the present invention.

SUMMARY

Embodiments provide a method of processing semiconductor chips. The method includes measuring locations of semiconductor dies placed on a carrier with a scanner to generate die location information. The method includes applying a dielectric layer over the semiconductor dies and communicating the die location information to a laser assembly. The method includes aligning the laser assembly with the carrier and laser structuring the dielectric layer with the laser assembly based on the die location information generated by the scanner.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 6 is a cross-sectional view of dies embedded in a fan-out molded material and including a dielectric that has been opened to form electrical communication paths to each die according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a system and method for expediting processing of semiconductor chips. The system and method employ a scanner to generate die location information for semiconductor dies placed on a carrier and pass the die location information on to a photolithographic stepper or a laser assembly. The photolithographic stepper or the laser assembly is aligned with the carrier only once prior to exposing the semiconductor dies and forming openings that communicate with conductive portions of the dies.

Embodiments of the system and methods provided in this specification are applicable to the fabrication of any semiconductor package style, including embedded wafer level ball grid array packages (eWLB), redistributed chip packages (RCP), or other package styles.

Embodiments provide a process for quickly locating positions of semiconductor dies that have been redistributed onto a carrier and accurately photolithographically or laser opening contact pads on the dies. In one embodiment, semiconductor dies are fabricated on a wafer, singulated, and placed on a carrier subsequent to being electrically isolated with mold material. The redistributed semiconductor dies have variations in the position of their placements such that one semiconductor die might be rotated or translated out of alignment with a neighboring semiconductor die. Embodiments provided herein enable the measurement/calculation of die locations for each of the redistributed semiconductor dies. The die positions are communicated to a photolithographic stepper or laser assembly that aligns itself only one time prior to photolithographically exposing or laser drilling areas above the contact pads of the dies.

Fabricating semiconductor dies, such as dies in embedded wafer level packages, according to the embodiments described herein provides improve electrical connection with higher throughput in less processing time.

Figure 1:
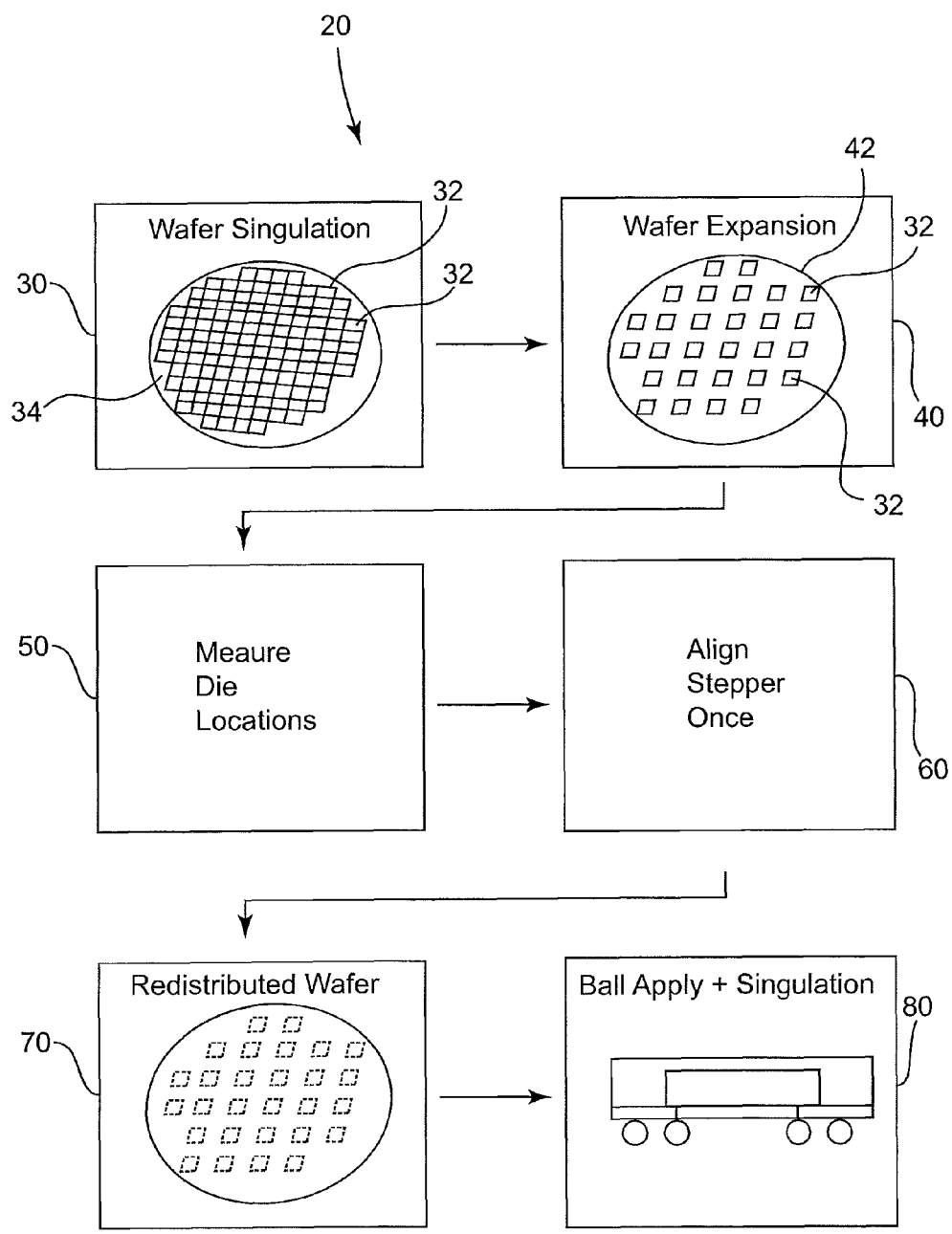
FIG. 1 is a schematic view of a process for fabricating semiconductor chips according to one embodiment.

FIG. 1 is a schematic view of a process 20 for fabricating semiconductor dies according to one embodiment. Process 20 includes at 30 singulating semiconductor chips 32 (or dies 32) from a wafer 34. At 40, dies 32 are placed on a carrier 42 to form a reconfigured wafer 42 with dies 32 in a fan-out pattern in which one die 32 is spaced apart from a neighboring die 32. Picking and placing dies 32 onto carrier 42 has the potential to misalign, misplace, rotate, or translate the dies 32 out of uniform alignment. The variation in the alignment can be small, even on the order of several micrometers, and still undesirably affect electrical connection and electrical performance of the dies. Consequently, it is desirable to determine the position of each die or smaller groups of dies prior to opening the contact pads on the dies 32 for electrical connection. At 50, the location of each die 32 on carrier 42 is measured. In one embodiment, the die locations are measured optically and stored in an electronic or digital format. At 60, a photolithographic stepper is aligned with carrier 42 only one initial time based on the measured location of the dies 32 or alignment marks. The photolithographic stepper exposes the dies 32 to form openings to contact pads on the dies 32. At 70, the redistributed dies have been opened and are prepared for subsequent electrical connection. At 80, one or more connections or other layers, for example redistribution layers, are patterned on the dies. In one embodiment, solder ball interconnects are electrically connected to redistribution layer(s) patterned over the dies with the scanner and the photolithographic stepper.

FIGS. 2a-2e provides multiple schematic cross-sectional views of one embodiment of semiconductor dies 32 redistributed on carrier 42.

Figure 2A:
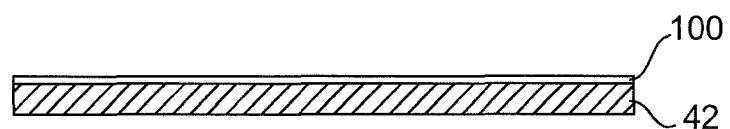
FIGS. 2a-2e illustrate multiple schematic cross-sectional views of the fabrication of semiconductor packages according to one embodiment.

FIG. 2a provides a cross-sectional view of carrier 42 including an adhesive layer 100. In one embodiment, carrier 42 is a reusable metal carrier in the form of a plate having a diameter between approximately 100-500 mm. One suitable carrier 42 is a 200 mm metal disc. In one embodiment, adhesive layer 100 is a double-sided adhesive layer, although other adhesive and/or attachment forms are also acceptable.

Figure 2B:
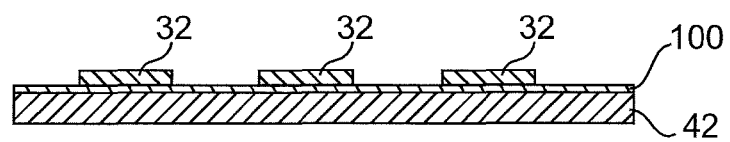

FIG. 2b illustrates semiconductor dies 32 picked and placed in contact with adhesive layer 100 on carrier 42. Picking and placing dies 32 onto carrier 42 has limited accuracy, for example the positional variation in the placement of dies 32 is plus/minus 5 micrometers at times.

Figure 2C:
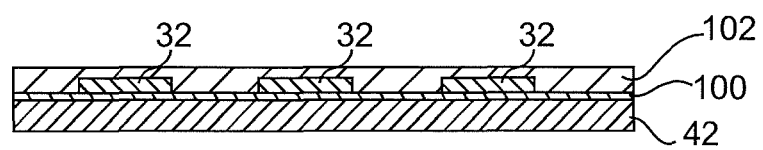

FIG. 2c is a cross-sectional view of mold material 102 encapsulated over dies 32. In one embodiment, mold material 102 is encapsulated over semiconductor dies 32 in a transfer molding process. In one embodiment, mold material 102 is encapsulated over dies 32 in a compression molding process. Mold material 102 includes polymer material, epoxies, or other suitable insulating and/or dielectric materials. Encapsulating dies 32 with mold material 102 will also tend to shift or non-uniformly displace the location of dies 32 on carrier 42. The positional variation in the placement of dies 32 after molding is typically plus/minus 15 micrometers at times.

Figure 2D:
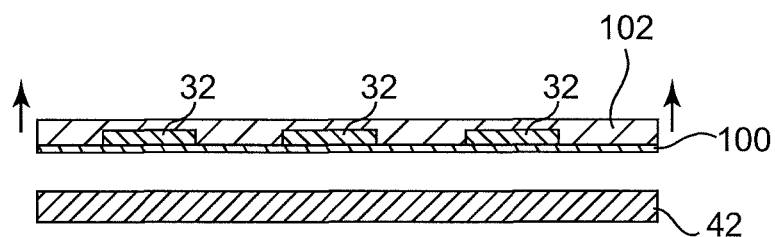

FIG. 2d illustrates dies 32 encapsulated in mold material 102 separated from carrier along the adhesive layer 100 interface. In one embodiment, carrier 42 is removed and reused.

Figure 2E:
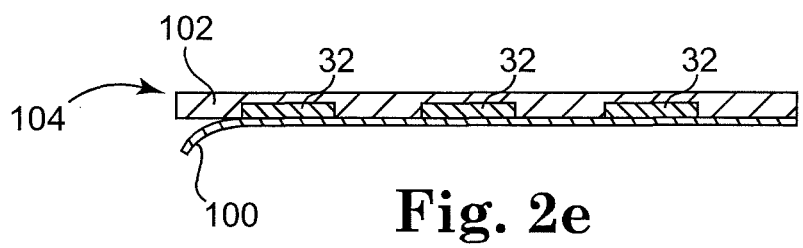

FIG. 2e illustrates adhesive layer 100 removed from dies 32 and mold material 102 to provide a molded reconfigured wafer 104. In one embodiment, molded reconfigured wafer 104 is a 200 mm wafer including dies 32 embedded in mold material 102 and suitable for post-processing to include an electrical redistribution layer and solder ball second level interconnects.

Figure 3:
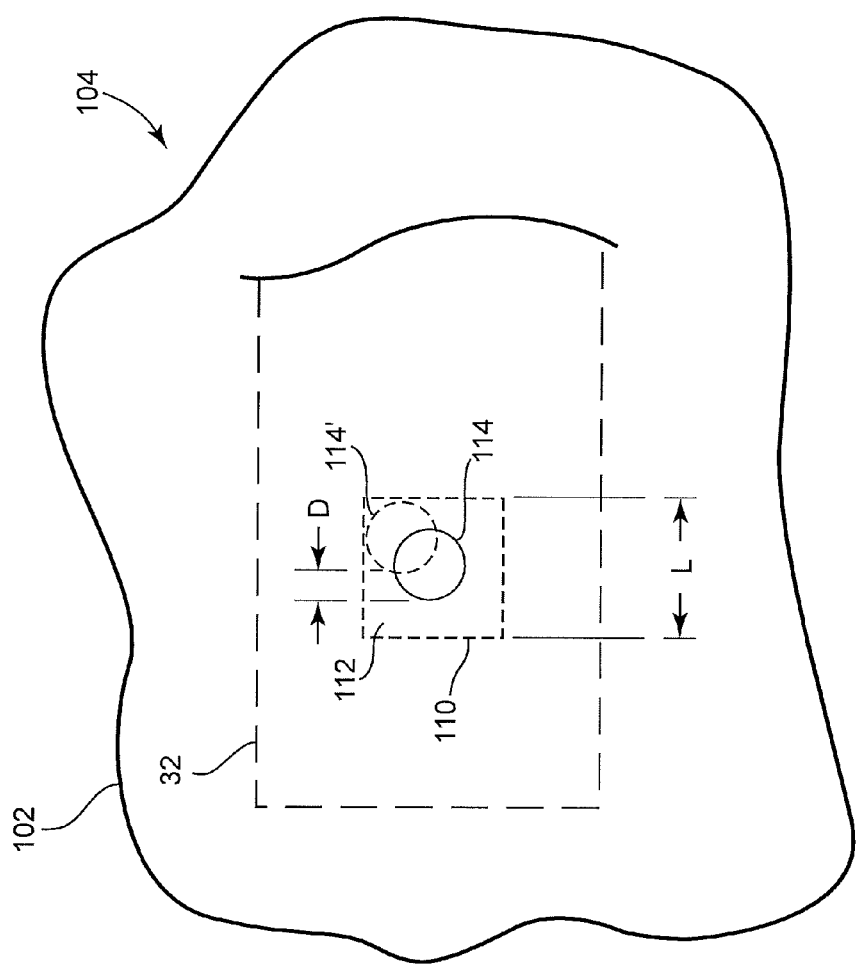
FIG. 3 is a top view of an opening formed in a dielectric layer above a conducting pad of a die according to one embodiment.

FIG. 3 is a top view of reconfigured wafer 104. Semiconductor die 32 is embedded in mold material 102 and includes a contact pad 110 covered by dielectric material 112. It is desirable to form an opening 114 through dielectric material 112 to provide an electrical communication path to contact pad 110. In one embodiment, opening 114 is formed with a photolithographic mask and exposure process.

As described above, die 32 has the potential to be misaligned when placed on carrier 42 (FIG. 2b) and when encapsulated by mold material 102 (FIG. 2c). The misalignment of die 32 has the potential to cause opening 114 to at least partly not align with contact pad 110. For example, in one embodiment contact pad 110 is provided as a square contact pad with a dimension of 64 micrometers on a side, and opening 114 is a substantially circular opening with a diameter of about 20 micrometers. Thus, the maximum tolerable displacement D for the desired opening 114' is about 22 micrometers. If the desired opening 114' is located outside of the maximum tolerable displacement D (i.e., opening 114' is not positioned entirely over contact pad 110) it is possible that the subsequent electrical connection to contact pad 110 will not be achieved. Alternatively, if the desired opening 114' exceeds the maximum tolerable displacement D by several micrometers, an insufficient or unacceptable electrical connection to contact pad 110 will be formed. Thus, it is desirable to accurately locate and form all openings 114 over all contact pads 110 within the maximum tolerable displacement distance D.

Figure 4:
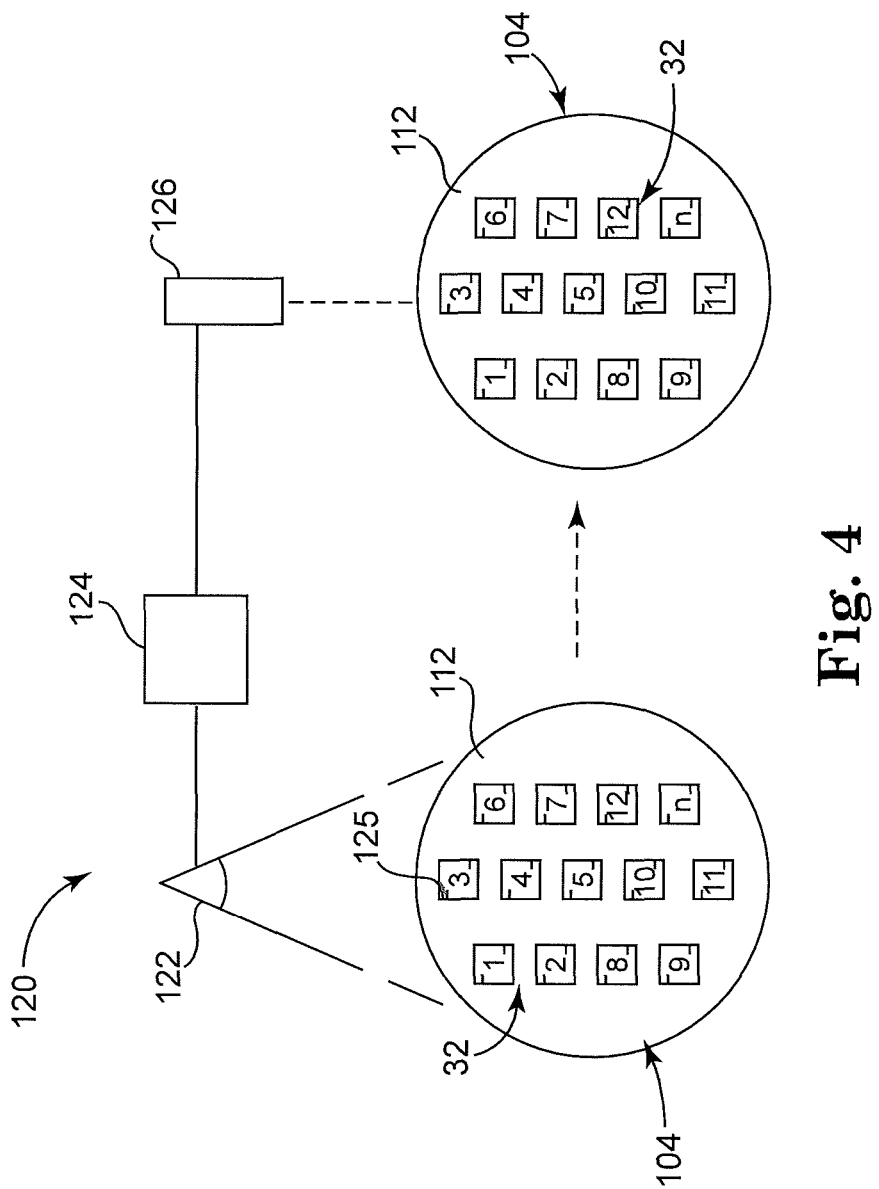
FIG. 4 is a schematic view of a system including an optical scanner and a photolithographic stepper employed to fabricate semiconductor packages according to one embodiment.

FIG. 4 is a schematic view of a system 120 configured to expedite processing of semiconductor packages according to one embodiment. System 120 includes a scanner 122 and a photolithographic stepper 126. Scanner 122 is configured to measure the positions of semiconductor dies 32, calculate an exposure matrix for a reconfigured wafer 104, and provide this data to a database to which stepper 126 has access. In one embodiment, scanner 122 is in electrical communication with an optional computer 124 operating software that is configured to store the measured position data of the dies 32, calculate the exposure matrix and/or location for stepper 126, and communicate this information to the database for use in stepper 126.

In one embodiment, scanner 122 is a Nikon VMR3020 optical scanner available from Nikon USA Melville, N.Y. and configured to measure a position of each of the dies 32. In one embodiment, the dies 32 include marks 125 (e.g., located on two corners of each die 32) that are optically visible by scanner 122. Scanner 122 is configured to calculate the amount of rotation or misplacement of each of the dies, and specifically, to measure and calculate the relative positions of each die 32. In one embodiment, the scanner 122 measures the relative and individual location of each die 32 on reconfigured wafer 104. In one embodiment, scanner 122 measures and records the relative location of multiple dies (for example between 8-20 dies) in a stepfield group. After measuring the relative position of dies 32, scanner 122 in one embodiment calculates an optimum exposure position for each of the dies 32 in one stepping field of the stepper and for all stepping positions and transfers this information to stepper 126.

In one embodiment, computer 124 includes memory and software that are configured to receive the location data and calculate an exposure matrix for stepper 126 relative to reconfigured wafer 104. Computers including any suitable memory and configured to operate computer executable functions are acceptable.

In one embodiment, stepper 126 is a photolithographic stepper available from Ultratech of San Jose, Calif. Other photolithographic steppers are also acceptable. The desired pattern to be formed on each of the dies as measured by scanner 122 is reproduced in a pattern of transparent and opaque areas on a surface of a quartz plate (a photo mask or reticle). Stepper 126 passes light through the reticle to form an image of the reticle pattern on each of the dies 32. The image is focused and reduced by a lens and projected onto the surface of each of the dies 32 (or the dielectric 112 covering the dies 32). Those of skill in the photolithographic art will recognize that dies 32 are covered with a dielectric material of a suitable photosensitive photoresist.

After exposure by stepper 126, the reconfigured wafer 104 is developed to remove the photoresist and form openings to contact pads 110 of each die 32. In one embodiment, stepper 126 is aligned only one time relative to reconfigured wafer 104 after receiving the calculated data from scanner 122. Thereafter, stepper 126 subsequently moves across each of the dies 32 or exposes all dies 32 without having to re-align or be re-aligned a second time. In this manner, stepper 126 is enabled by system 120 to locate every die 32 on wafer 42, align with wafer 104 one initial time and expose the dies 32 based on the scanned position data, even though the relative position of the dies 32 may be misaligned.

In contrast, the known photolithographic steppers locate each die or small groups of dies separately for every die or small groups on a wafer, expose the die or small groups of dies, and then repeat this process for each subsequent die or small groups of dies, which is time consuming and process-limiting.

Figure 5:
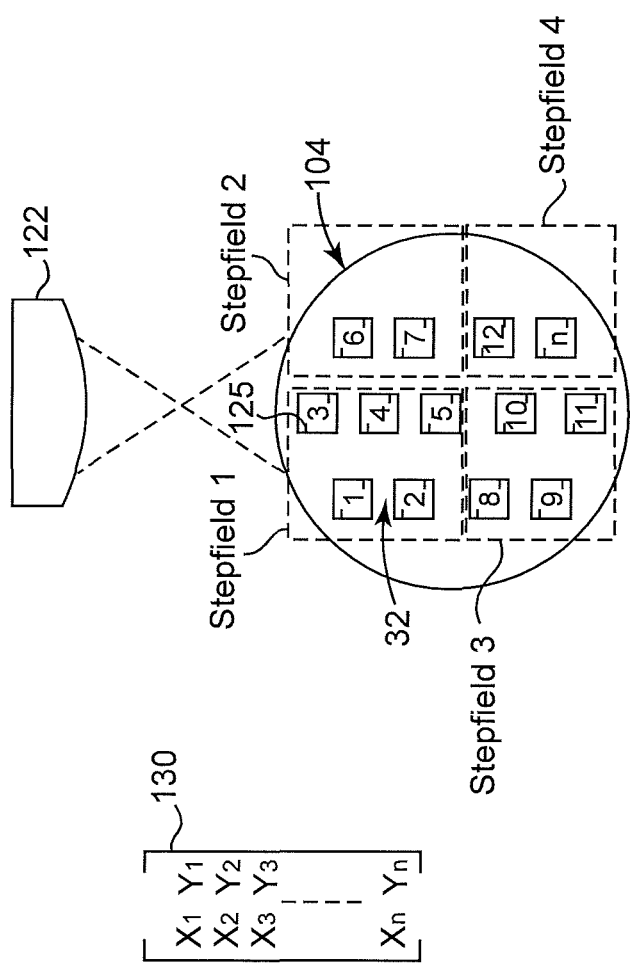
FIG. 5 is a schematic view of stepfields formed by the optical scanner illustrated in FIG. 4 according to one embodiment.

FIG. 5 is a schematic view of exemplary stepfields 1-4 generated by scanner 122 in measuring locations for each of dies 32. In one embodiment, scanner 122 employs software (not shown) configured to divide reconfigured wafer 104 into multiple stepfields. As an example, stepfield 1 includes dies 1, 2, 3, 4, and 5; stepfield 2 includes dies 6 and 7; stepfield 3 includes dies 8, 9, 10, and 11; and stepfield 4 includes dies 12, . . . , n. The number and size of stepfield(s) is not limited. In one embodiment, reconfigured wafer 104 is segregated into multiple stepfields of approximately 8-24 dies each, although other stepfield sizes are also acceptable.

Scanner 122 optically captures/measures a location of each die 32, for example by recognizing a mark 125 located on dies 32, and generates die position location information X1, Y1; X2, Y2; . . . , Xn, Yn that is stored in an electronically accessible data field 130. In one embodiment, scanner 122 optically captures/measures a location of each die 32 in stepfield 1 before capturing/measuring the locations of dies in stepfield 2. In one embodiment, scanner 122 optically captures/measures a location of each die 32 in all stepfields 1-4.

In one embodiment, scanner 122 generates data field 130 and transfers data field 130 to computer 124 for calculation of the desired exposure distance for stepper 126 (FIG. 4). In one embodiment, scanner 122 generates data field 130 and calculates an exposure distance to the reconfigured wafer 104 prior to transferring this information to stepper 126.

FIG. 6 is a cross-sectional view of reconfigured wafer 104 according to one embodiment. Dies 32 include contact pads 110 and openings 114 formed in dielectric 112 communicating with contact pads 110. In one embodiment, system 120 is employed to sequentially move stepper 126 from one die to the next to photolithographically form openings 114 that are aligned above contact pads 110 within the maximum tolerable displacement distance D (FIG. 3).

FIGS. 7A-7H illustrate multiple schematic cross-sectional views of embodiments of the system 120 illustrated in FIG. 4 employed to pattern layers in a semiconductor package. Embodiments include employing system 120 to pattern a resist layer over dielectric layer 112, and pattern a redistribution layer into the resist layer, as described below. Embodiments additionally include employing system 120 to pattern a solder resist layer over the redistribution layer to form openings for solder ball interconnects, as described below.

Figure 7A:
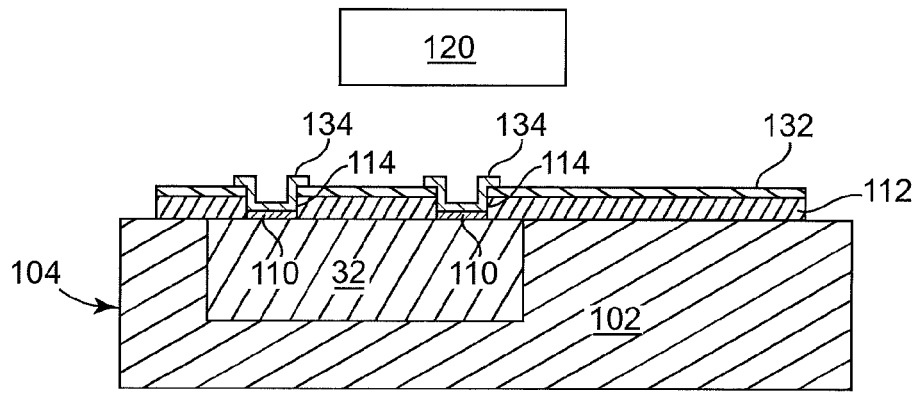
FIGS. 7A-7H illustrate multiple schematic cross-sectional views of embodiments of the system illustrated in FIG. 4 employed to pattern layers in a semiconductor package.

FIG. 7A is a cross-sectional view of system 120 described above employed to pattern a conductor 132 on dielectric 112 and pattern a conductive layer 134 into openings 114. In one embodiment, conductor 132 and conductive layer 134 are deposited concurrently. In one embodiment, no conductor 132 is applied to dielectric 112 when fabricating the intermediate product of FIG. 7A and conductive layer 134 is applied to the whole upper surface of dielectric 112, including into the through-holes 114 to electrically communicate with contact pads 110. In one embodiment, conductor 132 is patterned by system 120 to form a target to receive conductive layer 134.

Figure 7B:
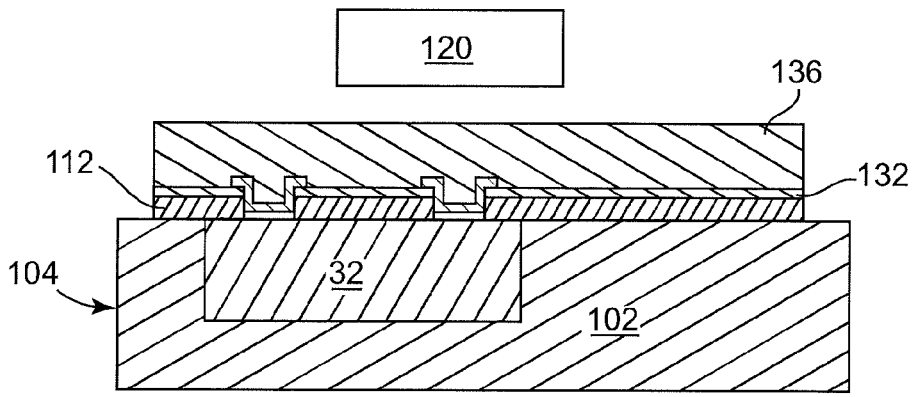

FIG. 7B is a cross-sectional view of system 120 described above employed to pattern a resist layer 136 onto the upper surface of conductor 132 and into the through-hole openings 114 of dielectric 112. Suitable resist layers 136 include a dry resist, a spin-coated resist or a sprayed resist having a thickness between 5 µm-30 µm. For example, in one embodiment resist layer 136 has a thickness of about 9 µm. In one embodiment, resist layer 136 is a dry resist that is laminated on the surface of conductor 132.

Figure 7C:
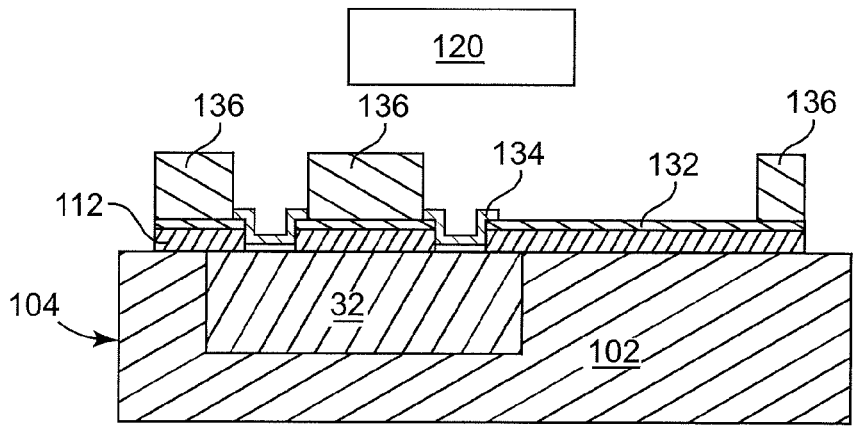

FIG. 7C is a cross-sectional view of system 120 described above employed to pattern and photolithographically expose and develop resist layer 136. In one embodiment, resist layer 136 is exposed with a laser direct imaging (LDI) process or other imaging method, the pattern of which is based on the die position data field 130 generated/collected by scanner 122 (FIG. 5). After developing of the resist layer 136, a predetermined portion of resist layer 136, as calculated by data field 130, is removed to open up electrically conductive contact areas over conductor 132 and conductive layer 134.

Figure 7D:
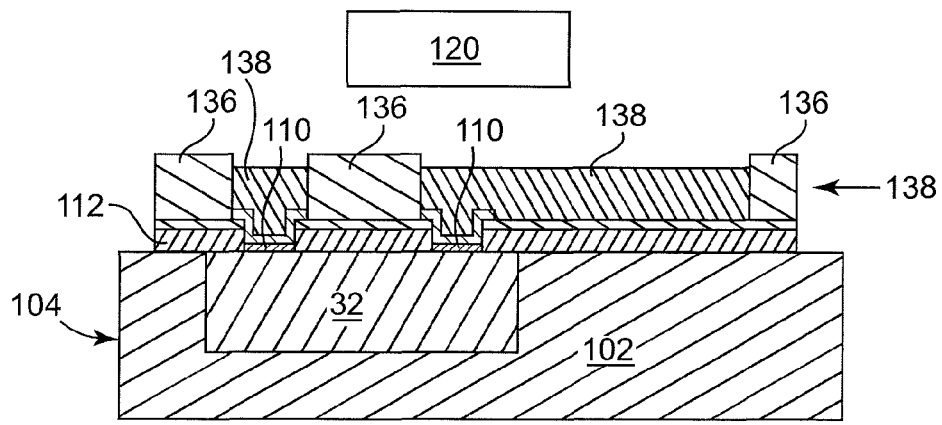

FIG. 7D is a cross-sectional view of system 120 described above employed to pattern contacts 138 into the remaining portions of through-hole openings 114 and on the regions of conductor 132. In one embodiment, contacts 138 form part of a redistribution layer 138 (RDL 138) for electrically redistributing contact pads 110 to a larger area. In one embodiment, RDL 138 is fabricated by electroplating in a strong agitated electrolyte, for example. Other suitable deposition processes for RDL 138 are also acceptable, including galvanic plating, or chemical plating, or conductive printing. It is to be understood that RDL 138 may extend in a direction perpendicular to the FIG. 7 image plane.

Figure 7E:
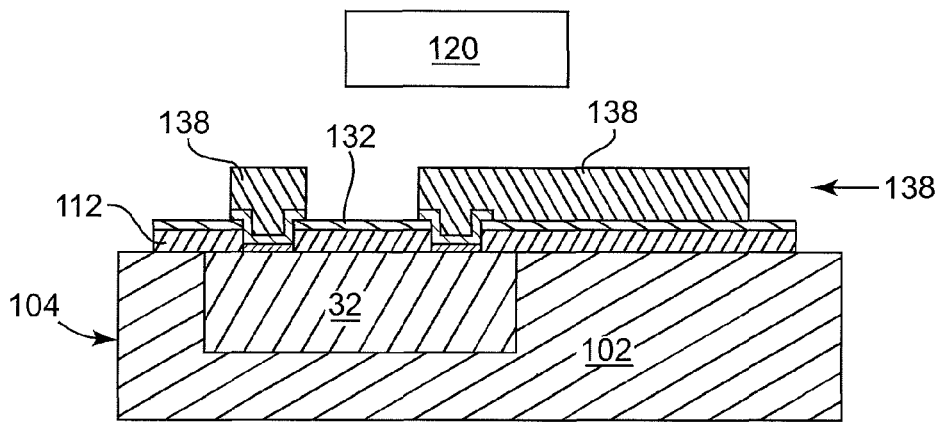

FIG. 7E is a cross-sectional view of an intermediate product fabricated after etching the remaining portions of resist layer 136 (FIG. 7D) to leave behind RDL 138.

Figure 7F:
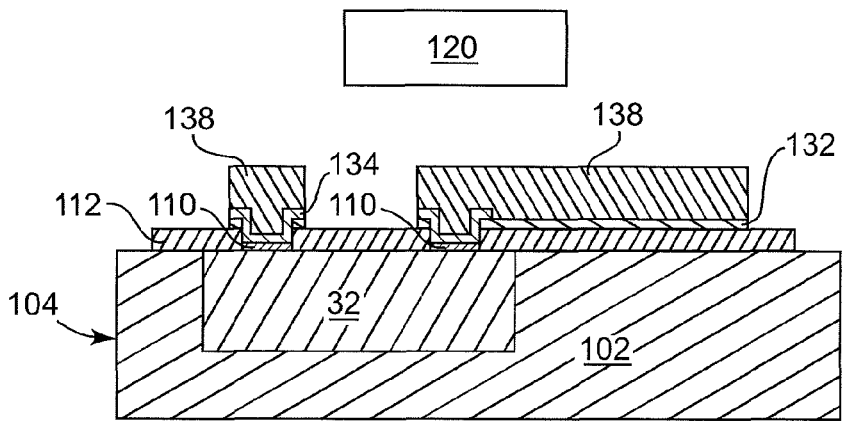

FIG. 7F is a cross-sectional view of a further intermediate product obtained after etching away a remaining exposed portion of conductor 132 (FIG. 7E) to electrically separate RDL 138 into a desired pattern across reconfigured wafer 104.

Figure 7G:
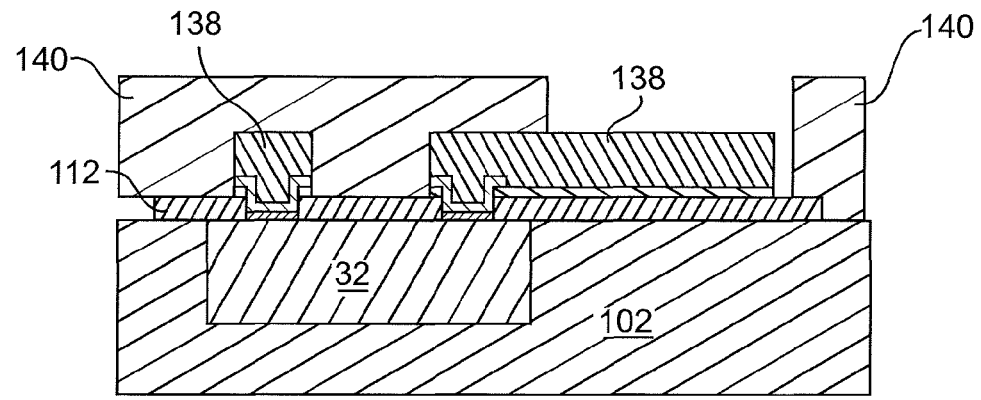

FIG. 7G is a cross-sectional view of system 120 described above employed to pattern a solder resist layer 140 over the intermediate product fabricated in FIG. 7F. In one embodiment, solder resist layer 140 is structured according to the die location data field 130 so that portions of RDL 138 are not covered by solder resist layer 140.

Figure 7H:
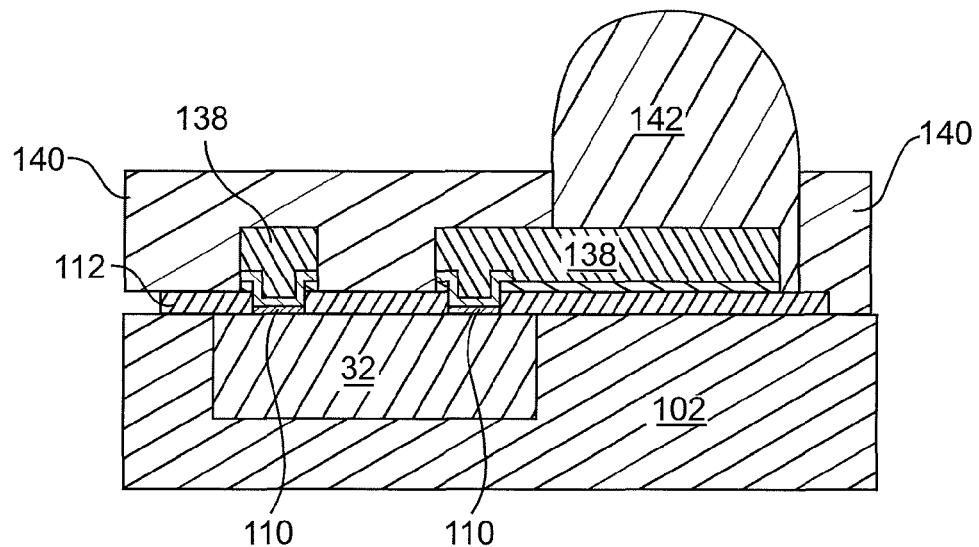

FIG. 7H is a cross-sectional view of a segment of an embedded wafer level ball grid array 150 (eWLB) fabricated by system 120 (FIG. 4) according to one embodiment. Solder balls 142 (only one of which is illustrated in this segment of eWLB) are disposed into the openings of solder resist layer 140 so that each solder ball 142 is electrically connected with RDL 138 and contact pads 110 of die 32.

Figure 8:
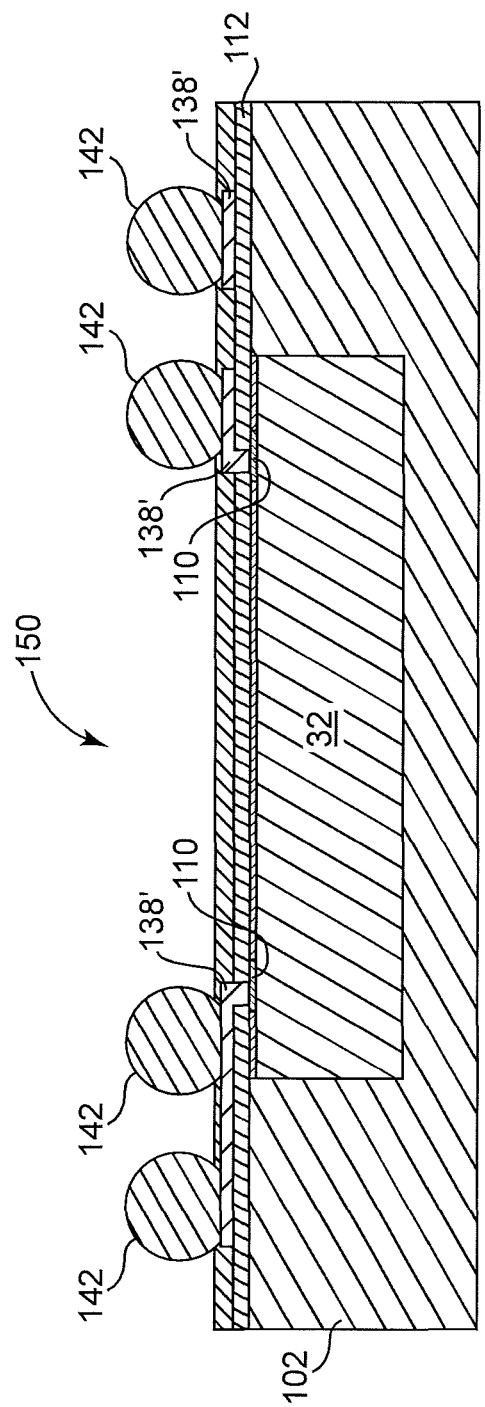
FIG. 8 is a cross-sectional view of an embedded wafer level package fabricated according to one embodiment.

FIG. 8 is a cross-sectional view of an embedded wafer level package 150 fabricated by system 120 according to another embodiment. Reconfigured wafer 104 (such as in FIG. 6) is singulated into individual packages 150 including chip 32 embedded within mold material 102 (fan-out area). In one embodiment, system 120 is employed to pattern RDL 138' for second level interconnection with multiple solder balls 142. RDL 138' forms an electrical communication pathway to die 32. In one embodiment, second level interconnections are provided, for example, by solder balls 142 that electrically connect with RDL 138' to provide vertical interconnection for chip 32.

Embodiments provide a fast lithography process including an optical scanner 122 communicating with a stepper 126 that enables the stepper to align relative to the wafer only once to account for die shift compensation within a reconfigured wafer of semiconductor dies.

FIGS. 9a-9d illustrate multiple schematic cross-sectional views of the fabrication of semiconductor packages according to one embodiment.

Figure 9A:
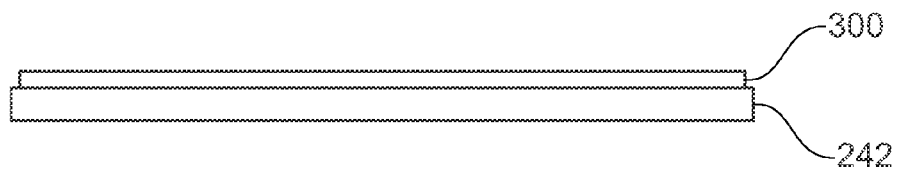
FIGS. 9a-9d illustrate multiple schematic cross-sectional views of the fabrication of semiconductor packages according to one embodiment.

FIG. 9a provides a cross-sectional view of carrier 242 including an adhesive layer 300. In one embodiment, carrier 242 is a reusable metal carrier, silicon carrier, or polymer carrier in the form of a plate having a width between approximately 100-300 mm. One suitable carrier 242 is a 250 mm wide square plate. In one embodiment, adhesive layer 300 is a double-sided adhesive layer, although other adhesive and/or attachment forms are also acceptable.

Figure 9B:
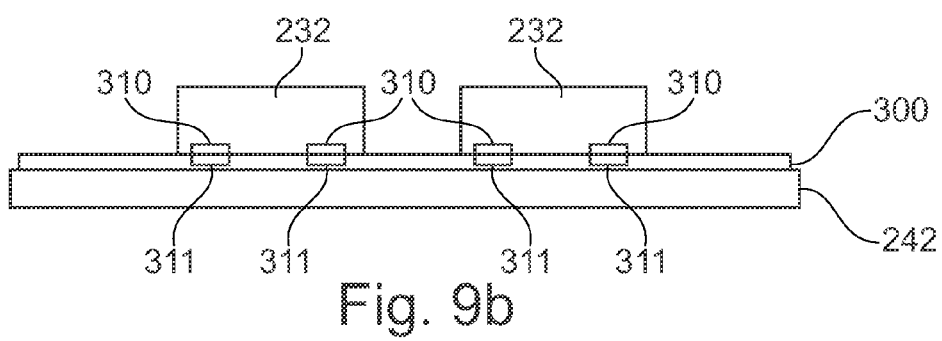

FIG. 9b illustrates semiconductor dies 232 picked and placed in contact with adhesive layer 300 on carrier 242. Picking and placing dies 232 onto carrier 242 has limited accuracy, for example the positional variation in the placement of dies 232 is plus/minus 5 micrometers at times. Each semiconductor die 232 includes a plurality of contact pads 310. In one embodiment, contact pads 310 are made of aluminum. A post 311 is disposed on each contact pad 310 to protect the contact pads during subsequent fabrication processes. In one embodiment, posts 311 are made of copper.

Figure 9C:
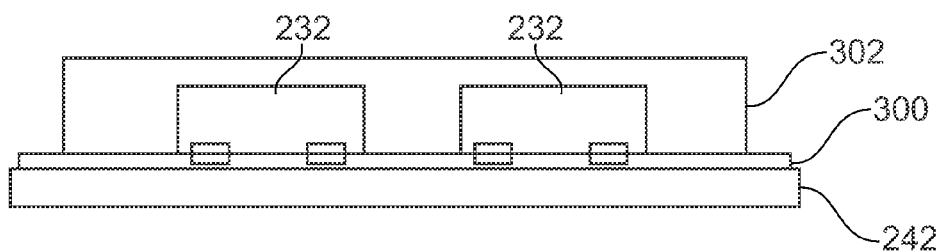

FIG. 9c is a cross-sectional view of mold material 302 encapsulated over dies 232. In one embodiment, mold material 302 is encapsulated over semiconductor dies 232 in a transfer molding process. In one embodiment, mold material 302 is encapsulated over dies 232 in a compression molding process. Mold material 302 includes polymer material, epoxies, or other suitable insulating and/or dielectric materials. Encapsulating dies 232 with mold material 302 will also tend to shift or non-uniformly displace the location of dies 232 on carrier 242. The positional variation in the placement of dies 232 after molding is typically plus/minus 15 micrometers at times.

Figure 9D:
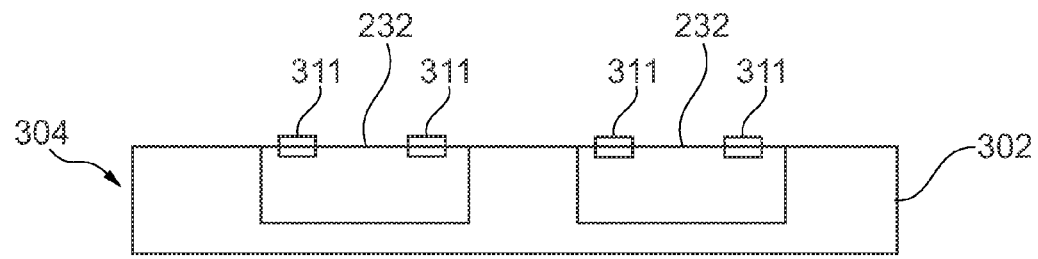
Figure 9E:
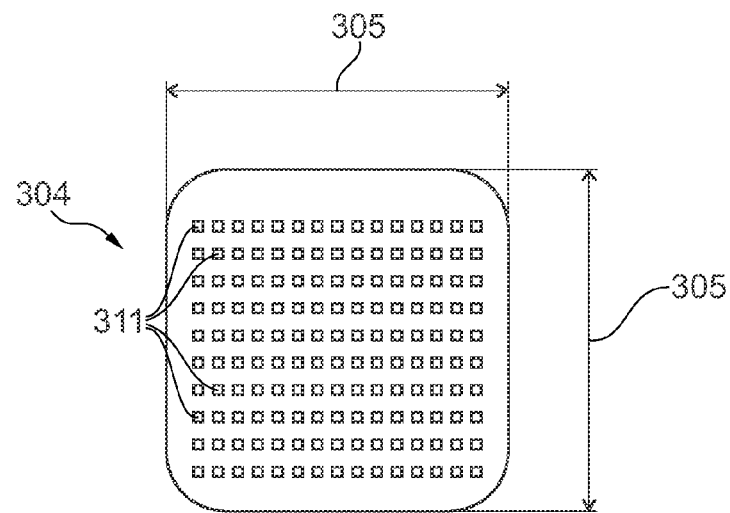
FIG. 9e illustrates a top view of a molded reconfigured wafer according to one embodiment.

FIG. 9d illustrates a cross-sectional view and FIG. 9e illustrates a top view of dies 232 encapsulated in mold material 302 and separated from carrier 242 and adhesive layer 300 to provide a molded reconfigured wafer 304. In one embodiment, molded reconfigured wafer 304 is a 250 mm square as indicated at 305 and includes dies 232 embedded in mold material 302. Reconfigured wafer 304 is suitable for post-processing to include an electrical redistribution layer and solder ball second level interconnects.

Figure 10:
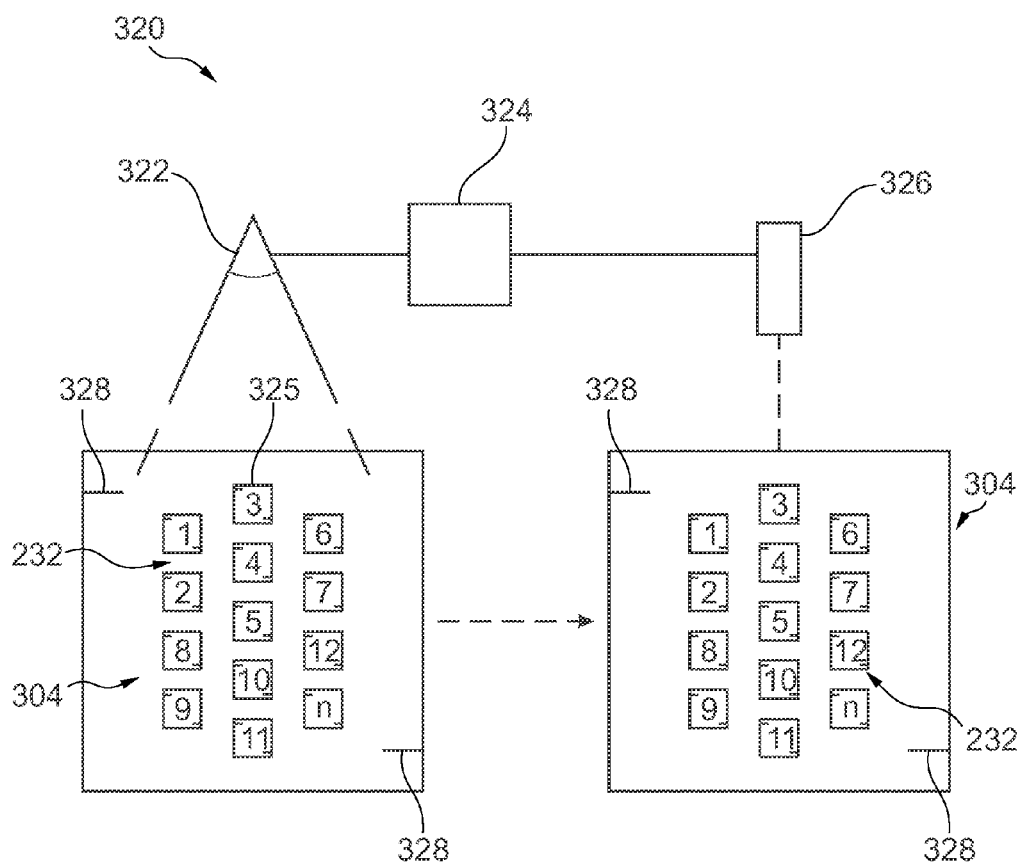
FIG. 10 is a schematic view of a system including an optical scanner and a laser assembly employed to fabricate semiconductor packages according to one embodiment.

FIG. 10 is a schematic view of a system 320 configured to expedite processing of semiconductor packages according to one embodiment. System 320 includes a scanner 322 and a laser assembly 326. Scanner 322 is configured to measure the positions of semiconductor dies 232, determine the position of each contact pad of each die 232 of reconfigured wafer 304, and provide this data to a database to which laser assembly 326 has access. In one embodiment, scanner 322 is in electrical communication with an optional computer 324 operating software that is configured to store the measured position data of the dies 232, determine the position of each contact pad of each die 232, and communicate this information to the database for use in laser assembly 326.

In one embodiment, scanner 322 is a Nikon VMR3020 optical scanner available from Nikon USA Melville, N.Y. and configured to measure a position of each of the dies 232. In one embodiment, scanner 322 measures the position of each of the dies 232 based on marks 325 (e.g., located on two corners of each die 232) that are optically visible by scanner 322. In another embodiment, scanner 322 determines the position of each of the dies 232 by measuring the position of two contact pads of each of the dies 232. Scanner 322 is configured to calculate the amount of rotation or misplacement of each of the dies, and specifically, to measure and calculate the relative positions of each die 232 and the positions of each contact pad of each die 232. In one embodiment, the scanner 322 measures the relative and individual location of each die 232 and each contact pad of each die on reconfigured wafer 304.

In one embodiment, computer 324 includes memory and software that are configured to receive the location data for controlling laser assembly 326 relative to reconfigured wafer 304. Computers including any suitable memory and configured to operate computer executable functions are acceptable.

Laser assembly 326 includes a laser for laser structuring patterns on each of the dies as measured by scanner 322. In one embodiment, a dielectric layer applied over reconfigured wafer 304 is structured by the laser to form openings to posts 311 of each die 232, as will be described further with reference to FIGS. 12a-13. In one embodiment, laser assembly 326 is aligned only one time relative to reconfigured wafer 304 after receiving the calculated data from scanner 322. In one embodiment, laser assembly 326 may be aligned to reconfigured wafer 304 based on marks 328 (e.g., located on two corners of each reconfigured wafer 304) that are optically visible by laser assembly 326. In other embodiments, laser assembly 326 may be aligned to reconfigured wafer 304 based on other suitable optically visible features on a die, such as pads or copper bumps. The measurement of two distinctive features is sufficient for performing the alignment. Thereafter, laser assembly 326 subsequently moves across each of the dies 232 without having to re-align or be re-aligned a second time. In this manner, laser assembly 326 is enabled by system 320 to locate every die 232 on reconfigured wafer 304, align with reconfigured wafer 304 one initial time and form structured layers on reconfigured wafer 304 based on the scanned position data, even though the relative position of the dies 232 may be misaligned.

Figure 11:
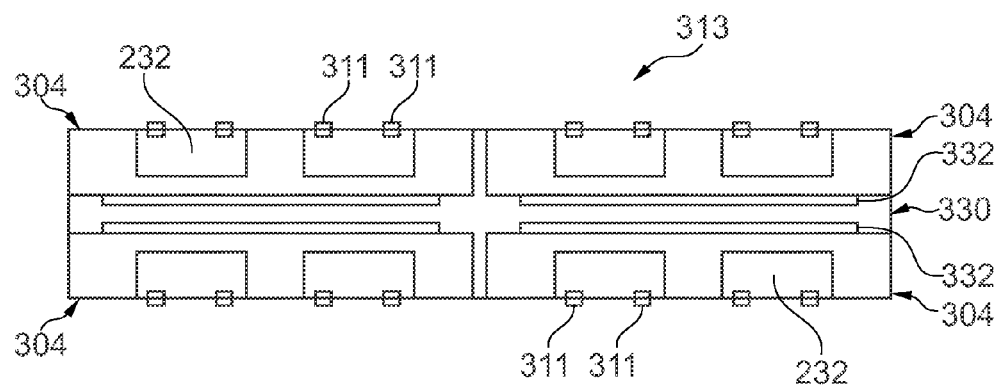
FIG. 11 is a schematic cross-sectional view of a plurality of molded reconfigured wafers attached to a core carrier according to one embodiment.

FIG. 11 is a schematic cross-sectional view of a plurality of molded reconfigured wafers 304 attached to a core carrier 330 according to one embodiment. In one embodiment, carrier 330 includes a metal carrier or a polymer carrier and adhesive layers 332 formed in the carrier 330. One adhesive layer 332 is provided for each reconfigured wafer 304. A first plurality of reconfigured wafers 304 are applied to a first face of carrier 330, and a second plurality of reconfigured wafers 304 are applied to a second face of carrier 330 opposite the first face to provide a panel 313 (i.e., a plurality of reconfigured wafers attached to a carrier). The reconfigured wafers 304 are applied to carrier 330 such that posts 311 face away from carrier 330. In one embodiment, four reconfigured wafers 304 are applied to each face of carrier 330.

In one embodiment, scanner 322 of system 320 previously described and illustrated with reference to FIG. 10, measures the positions of semiconductor dies 232, and determines the position of each contact pad of each die 232 of each reconfigured wafer 304 on panel 313, and provides this data to laser assembly 326.

Figure 12A:
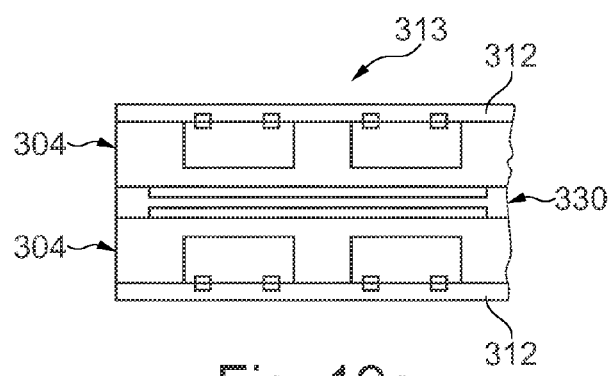
FIG. 12a is a schematic cross-sectional view.
Figure 12B:
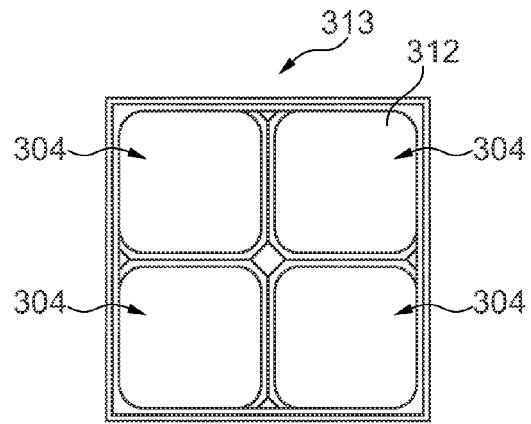
FIG. 12b is a top view of a dielectric layer over each side of the molded reconfigured wafers attached to the core carrier according to one embodiment.

FIG. 12a is a schematic cross-sectional view and FIG. 12b is a top view of a dielectric layer 312 over each side of panel 313. A dielectric layer 312, such as a dielectric film, is laminated to the top and bottom sides of panel 313.

Figure 13:
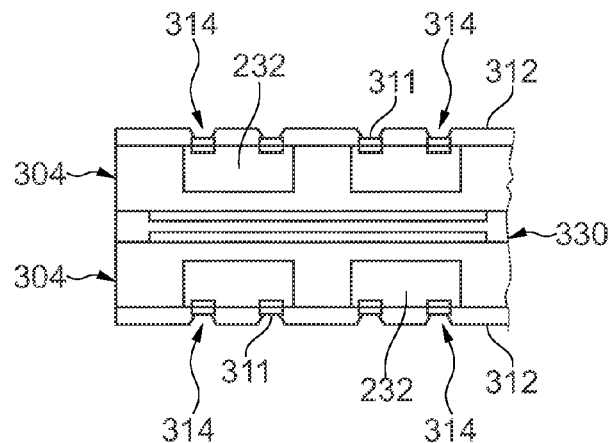
FIG. 13 is a schematic cross-sectional view of the dielectric layers that have been opened to form electrical communication paths to each die according to one embodiment.

FIG. 13 is a schematic cross-sectional view of dielectric layers 312 that have been opened at 314 to form electrical communication paths to each die 232 according to one embodiment. Dielectric layers 312 are structured based on the measured positions of semiconductor dies 232 to provide openings 314 exposing at least portions of posts 311. In one embodiment, system 320 (FIG. 10) is employed to sequentially move laser assembly 326 from one post 311 to the next to laser drill openings 314 that are aligned above posts 311 within the maximum tolerable displacement distance D (FIG. 3).

Figure 14:
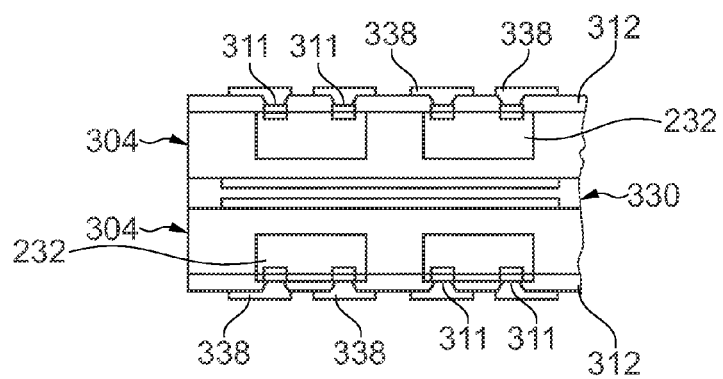
FIG. 14 is a schematic cross-sectional view of redistribution layers formed on each of the dielectric layers to form electrical connections to each die according to one embodiment.

FIG. 14 is a schematic cross-sectional view of redistribution layers 338 (RDLs 338) formed on each of the dielectric layers 312 and posts 311 to form electrical connections to each die 232 according to one embodiment. In one embodiment, RDLs 338 are formed as previously described with reference to FIGS. 7A-7F except that system 320 or a laser direct imaging tool (LDI) is used in forming RDLs 338 instead of photolithography.

Figure 15:
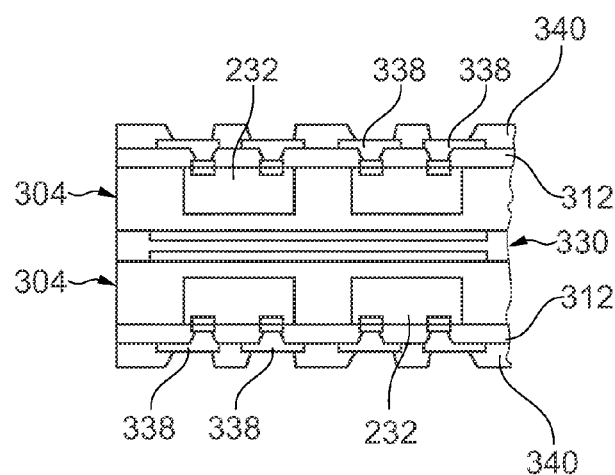
FIG. 15 is a schematic cross-sectional view of solder resist layers formed on each of the dielectric and redistribution layers according to one embodiment.

FIG. 15 is a schematic cross-sectional view of solder resist layers 340 formed on each of the dielectric layers 312 and RDLs 338 according to one embodiment. In one embodiment, a solder resist layer is laminated over each dielectric layer 312 and RDL 338. The solder resist layer is then structured by system 320 or an LDI based on the measured positions of semiconductor dies 232 so that portions of RDLs 338 are not covered by solder resist layer 340.

Figure 16A:
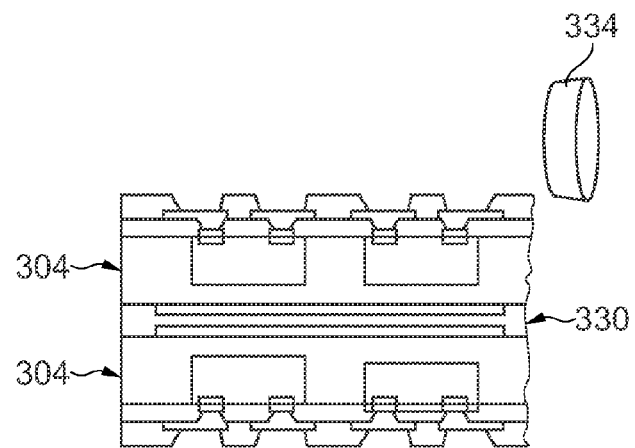
FIG. 16a is a schematic cross-sectional view.
Figure 16B:
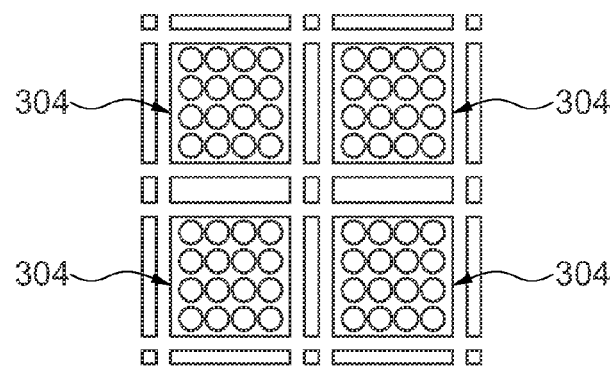
FIG. 16b is a top view of separating the molded reconfigured wafers according to one embodiment.

FIG. 16a is a schematic cross-sectional view and FIG. 16b is a top view of separating the molded reconfigured wafers according to one embodiment. A saw 334 or another suitable dicing device is used to separate panel 313 into separate quarter panels. Each quarter panel includes two reconfigured wafers 304 (i.e., one on each side) attached to a carrier 330. The reconfigured wafers 304 are then removed from the carrier 330.

Figure 17:
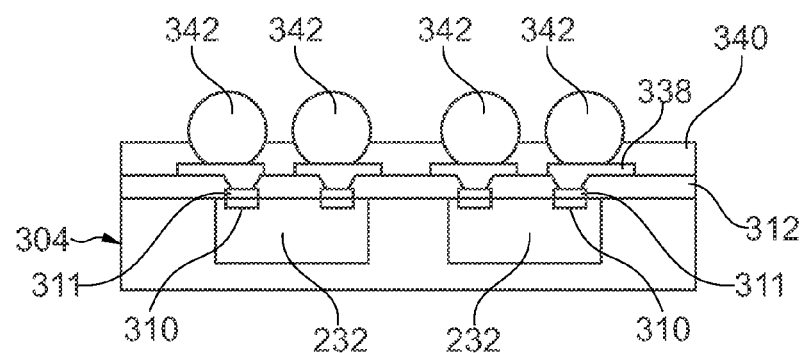
FIG. 17 is a schematic cross-sectional view of a molded reconfigured wafer including solder balls according to one embodiment.

FIG. 17 is a schematic cross-sectional view of a molded reconfigured wafer 304 including solder balls 342 according to one embodiment. Solder balls 342 are disposed into the openings of solder resist layers 340 so that each solder ball 342 is electrically connected with a RDL 338 and contact pads 310 of a die 232. Reconfigured wafer 304 including solder balls 342 may be singulated into individual packages to provide an embedded wafer level package as previously described and illustrated with reference to FIG. 8.

Embodiments provide a laser structuring process including an optical scanner 322 communicating with a laser assembly 326 that enables the laser assembly to align relative to the reconfigured wafer only once to account for die shift compensation within a reconfigured wafer of semiconductor dies.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of a system and method for processing semiconductor packages. Therefore, it is intended that this invention be limited only by the claims and the equivalents thereof.

What is claimed is:

1. A method of processing semiconductor chips, the method comprising:
measuring locations of semiconductor dies placed on a carrier with a scanner to generate die location information;
encapsulating the semiconductor dies to form a reconfigured wafer on the carrier, wherein a top surface of contact pads on each of the semiconductor dies are coplanar with a surface of the reconfigured wafer;
removing the reconfigured wafer from the carrier;
applying a dielectric layer over the semiconductor dies;
communicating the die location information to a laser assembly;
aligning the laser assembly with the carrier; and
laser structuring the dielectric layer with the laser assembly based on the die location information generated by the scanner.

2. The method of claim 1, comprising first semiconductor dies spaced apart in a fan-out configuration on a second face of the carrier opposite the first face.

3. The method of claim 1, wherein laser structuring comprises laser drilling the dielectric layer to form openings through the dielectric layer to contact pads of the dies.

4. The method of claim 3, wherein a copper post is disposed on each contact pad of the dies.

5. The method of claim 1, wherein applying the dielectric layer comprises laminating a dielectric layer over the semiconductor dies.

6. The method of claim 1, further comprising:
forming a redistribution layer over the structured dielectric layer based on the die location information generated by the scanner;
applying a solder resist layer over the redistribution layer;
laser structuring the solder resist layer with the laser assembly to provide an opening based on the die location information generated by the scanner; and
depositing an interconnect element in the opening.

7. The method of claim 6, wherein forming the redistribution layer comprises one of electroless plating and electroplating.

8. The method of claim 6, wherein applying the solder resist layer comprises laminating a solder resist layer over the redistribution layer.

9. A method of processing semiconductor chips, the method comprising:
- singulating dies from a wafer and redistributing the dies on a carrier;
- measuring locations of the dies redistributed on the carrier;
- encapsulating the semiconductor dies to form a reconfigured wafer on the carrier, wherein a top surface of contact pads on each of the semiconductor dies are coplanar with a surface of the reconfigured wafer;
- removing the reconfigured wafer from the carrier;
- laminating a dielectric layer over the dies;
- aligning a laser assembly with the carrier only one time; and
- laser structuring the dielectric layer based on the measured location of the dies redistributed on the carrier.

10. The method of claim 9, wherein measuring locations of the dies redistributed on the carrier comprises optically scanning a discrete location of each of the dies.

11. The method of claim 10, comprising optically scanning a discrete location of each of the dies in a single optical scan.

12. The method of claim 10, comprising calculating separate contact pad positions for each of the dies based on the discrete location of each of the dies, and communicating the calculated contact pad positions for each of the dies to the laser assembly.

13. The method of claim 12, wherein laser structuring the dielectric layer comprises laser drilling the dielectric layer at each of the separate contact pad positions for each of the dies.

14. The method of claim 9, wherein measuring locations of the dies redistributed on the carrier comprises optically scanning a discrete location of each of the dies by measuring the locations of two contact pads of each die.

15. A method of processing semiconductor chips, the method comprising:
- measuring locations of semiconductor dies in a molded reconfigured wafer to generate die location information, wherein a top surface of contact pads on each of the semiconductor dies are coplanar with a surface of the reconfigured wafer;
- communicating the die location to a laser assembly;
- applying the molded reconfigured wafer to a carrier;
- laminating the dielectric layer over the molded reconfigured wafer;
- aligning the laser assembly with the molded reconfigured wafer;
- laser structuring the dielectric layer with the laser assembly based on the die location information; and
- removing the reconfigured wafer from the carrier.

16. The method of claim 15, wherein measuring locations of the semiconductor dies in the reconfigured wafer comprises optically scanning a discrete location of each of the dies by measuring the locations of two contact pads of each die.

17. The method of claim 15, wherein laser structuring comprises laser drilling the dielectric layer to form openings through the dielectric layer exposing posts disposed on contact pads of the dies.

18. The method of claim 15, further comprising:
- forming a redistribution layer over the structured dielectric layer based on the die location information;
- applying a solder resist layer over the redistribution layer;
- laser structuring the solder resist layer with the laser assembly to provide an opening based on the die location information; and
- depositing an interconnect element in the opening.

19. The method of claim 18, wherein forming the redistribution layer comprises:
- applying a resist layer over the structure dielectric layer;
- laser structuring the resist layer with the laser assembly based on the die location information; and
- applying the redistribution layer by electroless plating or electroplating.

* * * * *